(12) United States Patent
Diewald et al.

(10) Patent No.: US 6,277,761 B1
(45) Date of Patent: Aug. 21, 2001

(54) METHOD FOR FABRICATING STACKED VIAS

(75) Inventors: Wolfgang Diewald, Fontainebleau (FR); Detlef Weber, Grünberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/621,433

(22) Filed: Jul. 21, 2000

Related U.S. Application Data

(63) Continuation of application No. PCT/DE99/00133, filed on Jan. 20, 1999.

(51) Int. Cl.$^7$ ..................................... H01L 21/00
(52) U.S. Cl. .............................. 438/710; 216/18; 216/38; 438/734; 438/737
(58) Field of Search ................... 216/18, 38, 67, 216/75, 79; 438/622, 627, 633, 637, 675, 692, 710, 723, 724, 734, 737, 743

(56) References Cited

U.S. PATENT DOCUMENTS

| 5,563,097 | 10/1996 | Lee . |
| 5,683,938 | 11/1997 | Kim et al. . |
| 5,786,275 | * 7/1998 | Kubo ................................. 216/38 X |
| 5,916,453 | * 6/1999 | Beilin et al. ........................ 216/38 |

* cited by examiner

Primary Examiner—William Powell
(74) Attorney, Agent, or Firm—Herbert L. Lerner; Laurence A. Greenberg; Werner H. Stemer

(57) ABSTRACT

A method for fabricating stacked vias for microelectronic components. The method has a first step of providing a first patterned interconnect layer on a substrate. A first insulating layer is then applied on the first interconnect layer. A first via is formed in the first insulating layer and is in contact with the first interconnect layer. A second patterned interconnect layer is applied on the first insulating layer, leaving free a region around the first via. A second insulating layer is then deposited on the second interconnect layer and on the region left free around the first via. A second via is formed in the second insulating layer in such a way that it meets the first via directly.

7 Claims, 5 Drawing Sheets

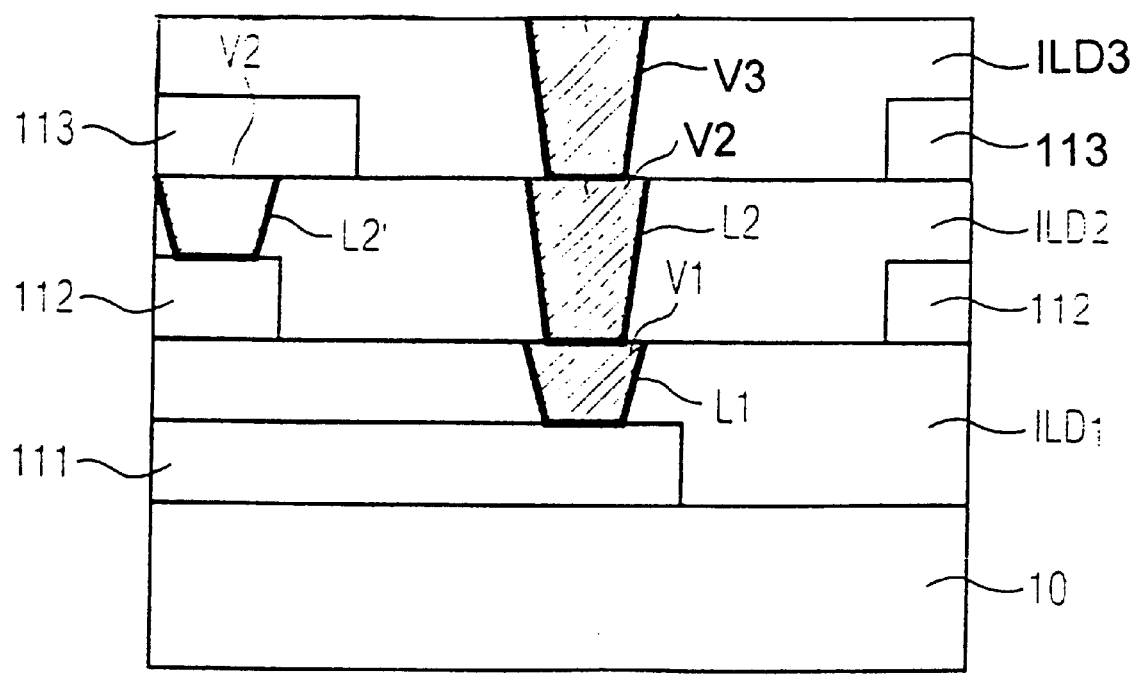

METHOD FOR FABRICATING STACKED VIAS

CROSS-REFERENCE TO RELATED APPLICATION

This is a continuation of copending International Application PCT/DE99/00133, filed Jan. 20, 1999, which designated the United States.

BACKGROUND OF THE INVENTION

Field of the Invention

The present invention relates to a method for fabricating stacked vias or electrical plated-through holes stacked one above the other for microelectronic components. A known configuration is disclosed in U.S. Pat. No. 5,710,462.

U.S. Pat. No. 5,328,553 describes a method for filling the contact holes.

Nowadays it is generally customary to provide a plurality of wiring planes in microelectronic components, the planes each being isolated from one another by intervening insulating layers. In order to connect together two wiring planes lying one above the other or to establish a contact between the first wiring plane and the microelectronic structures lying underneath, before the top wiring plane is applied, a through hole is formed in the intervening insulating layer and is filled with a conductive material. The top wiring plane is then applied and patterned.

If two wiring planes which do not lie directly one above the other are to be connected to one another, or if the microelectronic structures lying below the first wiring plane are to be connected directly to the second wiring plane, i.e. at least one further wiring plane lies in between, a stacked via is usually provided, as is explained in more detail below.

What has turned out to be disadvantageous in the case of the prior art is the fact that the metal area of a metal landing pad has to be made large enough that a lower via is definitely covered by it, or an upper via definitely lands on it.

Since this configuration is associated with a large space requirement, attempts are made to use smaller metal landing pads, thereby giving rise to the risk of the upper via reaching the side edge of the pad and the subsequently sputtered liner not being tight on account of pitting in the metal or dielectric. In particular, such small metal areas are difficult to reach in terms of resist engineering, which necessitates complicated and costly resist techniques or entails the risk of increased defect densities due to resist plugs tilting over.

Although the problem of the vias meeting the metal side edges with a non-tight liner can be supplemented by making the metal landing pads appropriately large, this entails a high space requirement. Liner deposition by sputtering can also be replaced by more expensive chemical vapor deposition (CVD).

SUMMARY OF THE INVENTION

It is accordingly an object of the invention to provide a method for fabricating stacked vias that overcomes the above-mentioned disadvantages of the prior art methods of this general type, which enables space to be saved without increased process risks.

With the foregoing and other objects in view there is provided, in accordance with the invention, a method for fabricating stacked vias for microelectronic components. A first patterned interconnect layer is provided on a substrate. A first insulating layer is applied on the first patterned interconnect layer. A first via is formed in the first insulating layer and is in contact with the first patterned interconnect layer, the forming of the first via step includes the steps of: forming a first hole in the first insulating layer by an anisotropic etching process; applying a first liner to the first hole; and filling the first hole with an electrically conductive material. A second patterned interconnect layer is then applied on the first insulating layer, leaving free a region around the first via. A second insulating layer is applied on the second patterned interconnect layer and on the region left free around the first via. A second via is formed in the second insulating layer such that the second via meets the first via directly, the forming of the second via step includes the steps of: forming a second hole in the second insulating layer by the anisotropic etching process; applying a second liner to the second hole; and filling of the second hole with the electrically conductive material. A further second via is formed in the second insulating layer and is in contact with the second patterned interconnect layer, and a formation of the further second via takes place simultaneously with a formation of the second via. The forming of the further second via step includes the steps of: forming a further second hole in the second insulating layer by the anisotropic etching process and by overetching the further second hole where the second patterned interconnect layer serves as a vertical etching stop during the overetching of the further second hole to allow the simultaneous formation of the second via and the further second via; applying a further second liner to the further second hole; and filling of the further second hole with the electrically conductive material.

Compared with the known solution approach, the method according to the invention has the advantage that a critical structure size is obviated during the lithography, namely that of the metal landing pad. Furthermore, a considerable amount of space is saved and the process risks occurring with regard to the metal landing pads are avoided. It is necessary to ensure merely that the insulating layer relating to the upper via is etched through.

The idea on which the present invention is based consists generally in forming the second patterned interconnect layer on the first insulating layer, leaving free a region around the first via, and not on the first via. The second insulating layer is then formed on the second interconnect layer and the region left free around the first via. Finally, the second via is formed in the second insulating layer in such a way that it meets the first via directly. In this respect, it shall be noted that the first interconnect layer may also be a microelectronic structure and need not necessarily be a metallic wiring plane.

According to the invention, the formation of the further second via takes place at the same time as the formation of the second via. Thus, the through-plating from the second to the third interconnect layer does not require an additional process step.

According to the invention, the second patterned interconnect layer is configured in such a way that, during the overetching, it forms a vertical etching stop for the further second via. As a result, the overetching can progress only in the horizontal direction, which has a less disturbing effect due to the anisotropic nature of the etching process.

According to the invention, a third patterned interconnect layer is provided on the second insulating layer and is in contact with the second via. A stack of two vias is thus produced.

In accordance with an added feature of the invention, the first liner, the second liner and the further second liner are formed from titanium or titanium nitride. Whereas the electrically conductive material contains tungsten.

In accordance with another feature of the invention, the anisotropic etching process is a plasma etching process.

In accordance with an additional feature the invention, the first liner, the second liner and the further second liner are sputtered on.

In accordance with a preferred development, the following steps are additionally carried out: applying a third patterned interconnect layer on the second insulating layer, leaving free a region around the second via and applying a third insulating layer on the third interconnect layer and the region left free around the second via. A third via in the third insulating layer is formed such that it meets the second via directly. Thus, even three or even more vias can be stacked one above the other.

Other features which are considered as characteristic for the invention are set forth in the appended claims.

Although the invention is illustrated and described herein as embodied in a method for fabricating stacked vias, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIGS. 1a to 1f are diagrammatic, sectional views of process steps for fabricating stacked vias for microelectronic components in accordance with the invention.

DESCRIPTION OF THE PREFERRED EMBODIMENTS

Figure 1A:
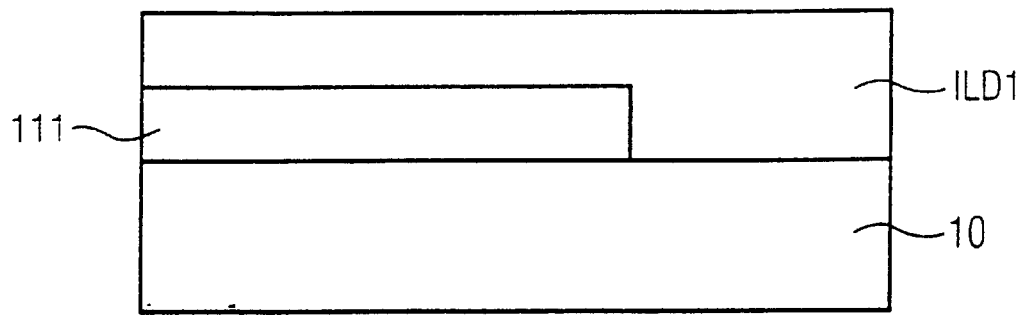

In all the figures of the drawing, sub-features and integral parts that correspond to one another bear the same reference symbol in each case. Referring now to the figures of the drawing in detail and first, particularly, to FIGS. 2a to 2e thereof, there is shown a diagrammatic illustration of the process steps that have been customary hitherto for fabricating stacked vias for microelectronic components.

In FIGS. 2a to 2e, the reference numeral 10 designates a substrate, the reference numerals 111, 112, 113 designate interconnect layers, reference designators ILD1, ILD2 designate insulating layers, reference designators L1, L2, L2' designate liners, reference designators H1, H2, H2' designate holes and reference designators V1, V2, V2' designate vias.

Figure 2A:
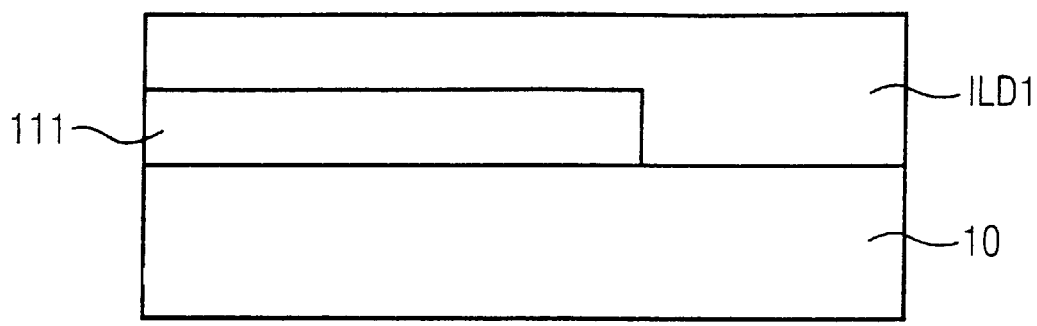
FIGS. 2a to 2e are sectional views of the prior art process steps for fabricating the stacked vias for the microelectronic components.

First, a first interconnect layer 111 is deposited on the substrate 10 and patterned, the substrate 10 expediently having an integrated electrical circuit (FIG. 2a).

Figure 2B:
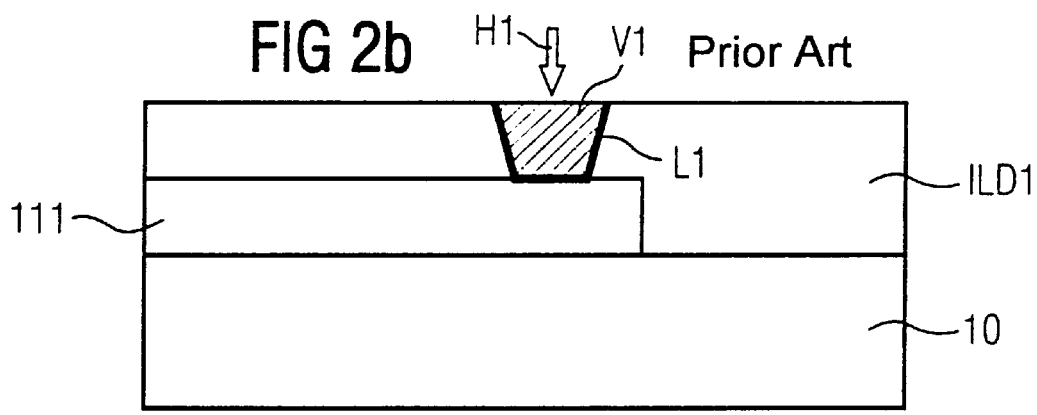

A first insulating layer ILD1 is then deposited on the first interconnect layer 111 and is planarized. A first via V1 is formed in the first insulating layer ILD1 in contact with the first interconnect layer 111 (FIG. 2b).

Figure 2C:
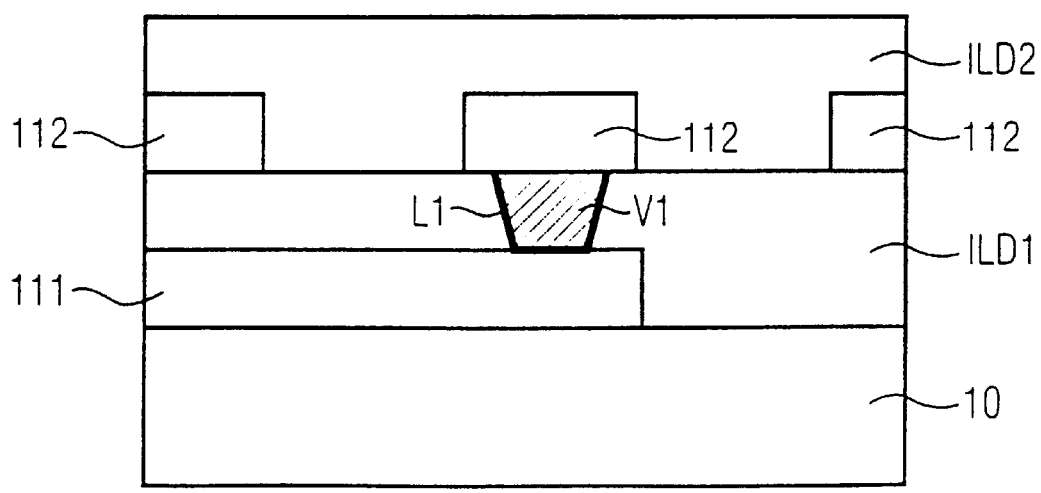

A second interconnect layer 112 is then deposited on the first insulating layer ILD1, in particular within a region around the first via V1, and is patterned. This region is also referred to as a metal landing pad 112 (FIG. 2c).

A second insulating layer ILD2 is then deposited on the second interconnect layer 112 and the region left free around the first via V1 and is planarized.

Figure 2D:
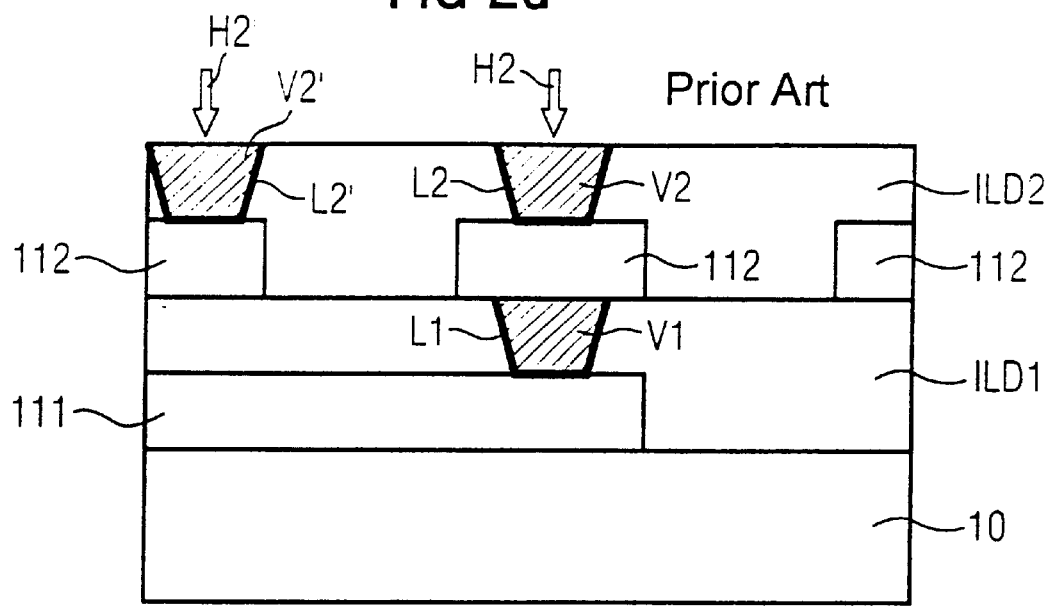

Afterwards, a second via V2 is formed in the second insulating layer ILD2 in exactly the same way as the first via V1 is formed, in such a way that it meets the interposed metal landing pad in the 112 plane (FIG. 2d).

At the same time, a further second via V2' is formed in the second insulating layer ILD2 in contact with the second interconnect layer 112.

Figure 2E:
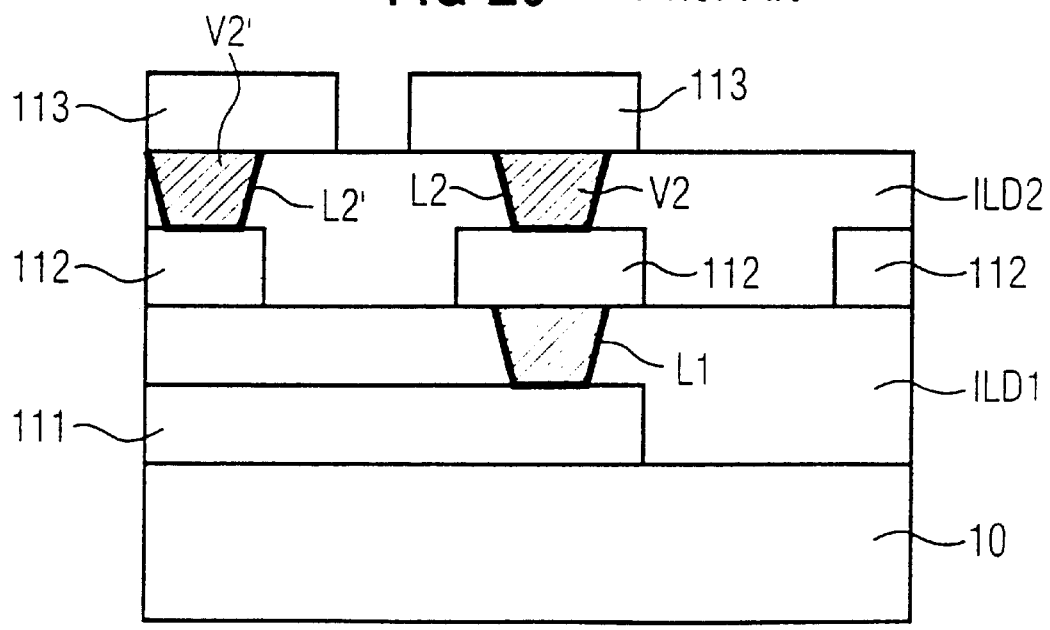

Finally, a third patterned interconnect layer 113 is provided on the second insulating layer ILD2 in contact with the second via V2 and the further second via V2' (FIG. 2e).

What has turned out to be disadvantageous in the case of the known approach above is the fact that the metal area of the metal landing pad 112 has to be made large enough that the lower via V1 is definitely covered by it, or the upper via V2 definitely lands on it.

Since this configuration is associated with a large space requirement, attempts are made to use smaller metal landing pads 112, thereby giving rise to the risk of the upper via V2 reaching a side edge of the pad 112 and the subsequently sputtered liner not being tight on account of pitting in the metal or dielectric. In particular, such small metal areas are difficult to reach in terms of resist engineering, which necessitates complicated and costly resist techniques or entails the risk of increased defect densities due to resist plugs tilting over.

Although the problem of the vias meeting the metal side edges with a non-tight liner can be supplemented by making the metal landing pads 112 appropriately large, this entails a high space requirement. Liner deposition by sputtering can also be replaced by more expensive chemical vapor deposition (CVD).

FIGS. 1a to 1e show a diagrammatic illustration of the process steps for fabricating the stacked vias for the microelectronic components in accordance with one embodiment of the present invention.

In FIGS. 1a–1e, the reference numeral 10 designates the substrate, the reference numerals 111, 112, 113 designate the interconnect layers, the reference designators ILD1, ILD2 designate the insulating layers, the reference designators L1, L2, L2' designate the liners, the reference designators H1, H2, H2' designate the holes and the reference designators V1, V2, V2' designate the vias.

First, the first interconnect layer 111 is deposited on the substrate 10 and patterned, the substrate 10 expediently having an integrated electrical circuit (FIG. 1a).

Figure 1B:
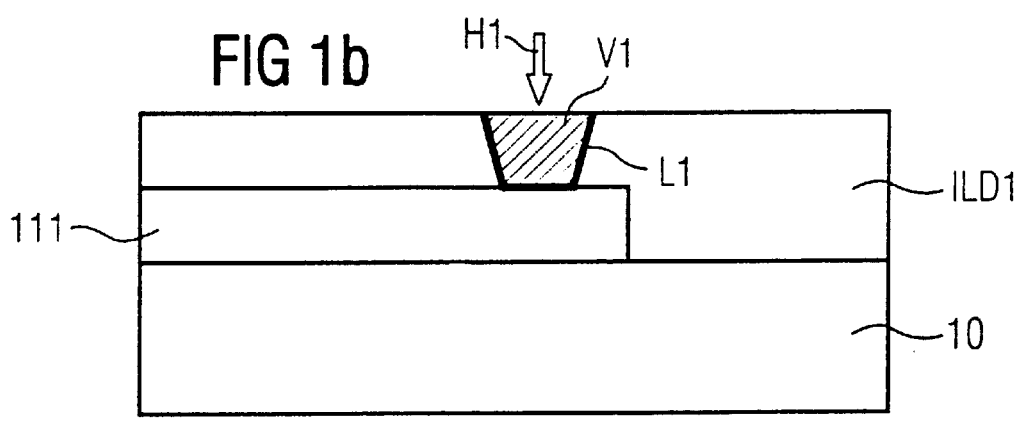

A first insulating layer ILD1 is then deposited on the first interconnect layer 111 and is planarized. The first via V1 is formed in the first insulating layer ILD1 in contact with the first interconnect layer 111. This is done by forming the hole H1 in the first insulating layer ILD1, sputtering on the liner L1 in the hole H1 and filling the hole H1 with an electrically conductive material (FIG. 1b).

The liner L1 is expediently made of titanium or titanium nitride, and an electrically conductive material of tungsten or a tungsten alloy, and is introduced by chemical vapor deposition (CVD).

Figure 1C:
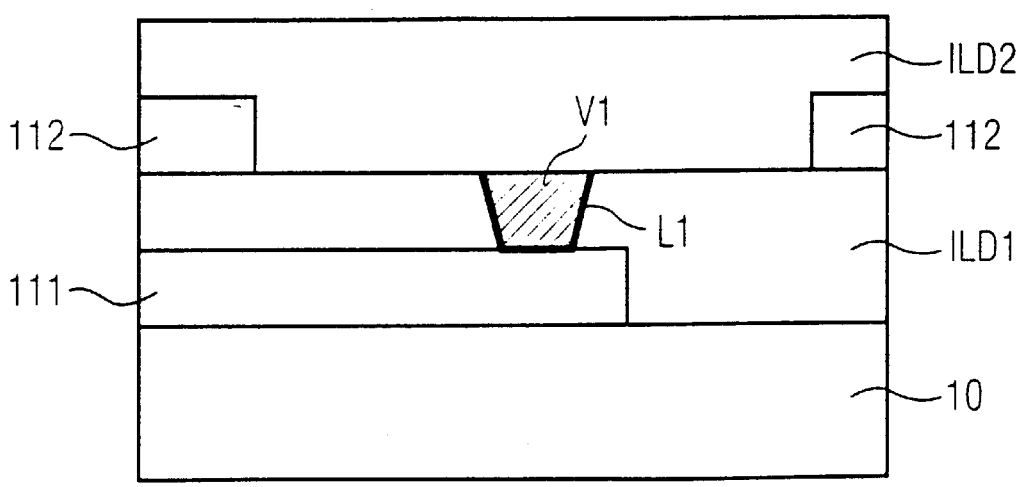

The second interconnect layer 112 is then deposited on the first insulating layer ILD1, leaving free a region around the first via V1, and is patterned. Analogously to the previous case, the second insulating layer ILD2 is then deposited on the second interconnect layer 112 and the region left free around the first via V1 and is planarized (FIG. 1c).

Figure 1D:
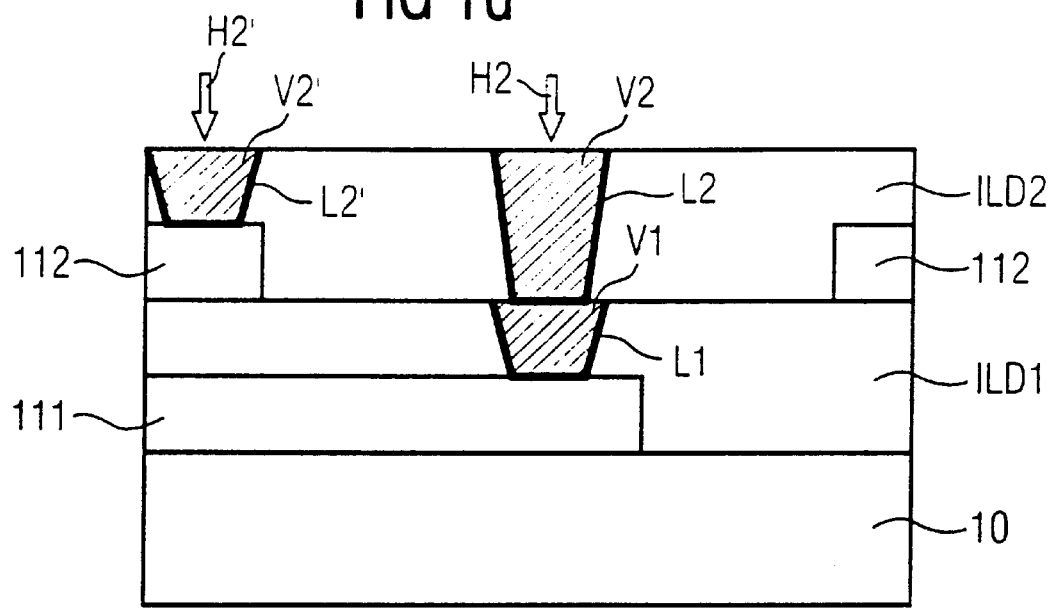

The second via V2 is then formed in the second insulating layer ILD2 in exactly the same way as the first via V1 is formed, but in such a way that it meets the first via V1 directly without the interposed metal landing pad 112 in the plane (FIG. 1d).

At the same time, a further second via V2' is formed in the second insulating layer ILD2 in contact with the second interconnect layer 112.

In this embodiment, the holes H1, H2 and H2' are formed by an anisotropic etching process, in particular plasma etching. Therefore, overetching of the further second via V2' occurs in the course of the simultaneous formation of the second via V2 with the further second via V2'. During this overetching, the second interconnect layer 112 forms a vertical etching stop below the hole H2'.

Figure 1E:
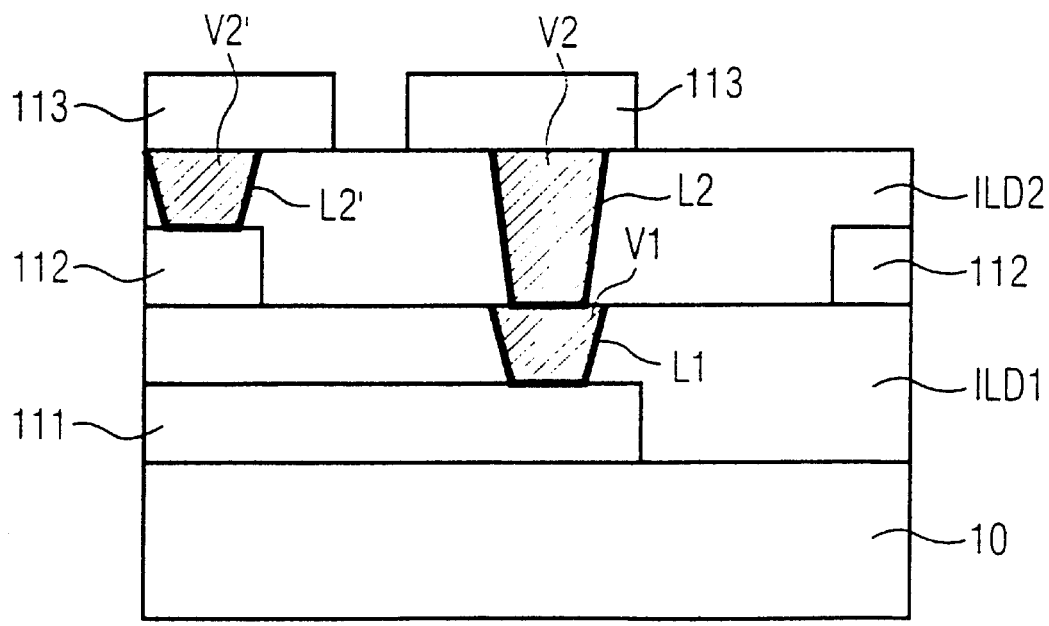

Finally, a third patterned interconnect layer 113 is provided on the second insulating layer ILD2 in contact with the second via V2 and the further second via V2' (FIG. 1e).

Although the present invention has been described above using preferred exemplary embodiments, it is not restricted thereto but rather can be modified in diverse ways.

Thus, it is possible, for example, to provide the third patterned interconnect layer 113 on the second insulating layer ILD2, leaving free a region around the second via V2, and a third insulating layer ILD3 on the third interconnect layer 113 and the region left free around the second via V2 (see FIG. 1f). A third via V3 can then be formed in the third insulating layer 113 in such a way that it meets the second via V2 directly, the second via V2 in turn meeting the first via V1 directly.

Likewise, it is possible, for example, to provide the first patterned interconnect layer 111 on the substrate 10, leaving free a region around the direct contact with the microelectronic structures lying underneath, with the result that the latter can be connected to the second or an even higher metal plane without the use of metal landing pads.

We claim:

1. A method for fabricating stacked vias for microelectronic components, which comprises the steps of:

providing a first patterned interconnect layer on a substrate;

applying a first insulating layer on the first patterned interconnect layer;

forming a first via in the first insulating layer being in contact with the first patterned interconnect layer, the forming of the first via step comprises the steps of:
  forming a first hole in the first insulating layer by an anisotropic etching process;
  applying a first liner to the first hole; and
  filling the first hole with an electrically conductive material;

applying a second patterned interconnect layer on the first insulating layer, leaving free a region around the first via;

applying a second insulating layer on the second patterned interconnect layer and on the region left free around the first via;

forming a second via in the second insulating layer such that the second via meets the first via directly, the forming of the second via step comprises the steps of:
  forming a second hole in the second insulating layer by the anisotropic etching process;
  applying a second liner to the second hole; and
  filling of the second hole with the electrically conductive material; and forming a further second via in the second insulating layer being in contact with the second patterned interconnect layer, and a formation of the further second via takes place simultaneously with a formation of the second via, the forming of the further second via step comprises the steps of:
  forming a further second hole in the second insulating layer by the anisotropic etching process and by overetching the further second hole where the second patterned interconnect layer serves as a vertical etching stop during the overetching of the further second hole to allow the simultaneous formation of the second via and the further second via;
  applying a further second liner to the further second hole; and
  filling of the further second hole with the electrically conductive material.

2. The method according to claim 1, which comprises forming the first liner, the second liner and the further second liner from a material selected from the group consisting of titanium and titanium nitride.

3. The method according to claim 1, which comprises forming the electrically conductive material from a material containing tungsten.

4. The method according to claim 1, which comprises the step of applying a third patterned interconnect layer on the second insulating layer and being in contact with the second via.

5. The method according to claim 1, which further comprises the steps of:

applying a third patterned interconnect layer on the second insulating layer, leaving free a region around the second via;

applying a third insulating layer on the third patterned interconnect layer and on the region left free around the second via; and forming a third via in the third insulating layer such that the third via meets the second via directly.

6. The method according to claim 1, which comprises utilizing a plasma etching process as the anisotropic etching process.

7. The method according to claim 1, which comprises sputtering on the first liner, the second liner and the further second liner.

* * * * *